United States Patent
Okuda et al.

(10) Patent No.: US 6,622,054 B1
(45) Date of Patent: Sep. 16, 2003

(54) METHOD MONITORING A QUALITY OF ELECTRONIC CIRCUITS AND ITS MANUFACTURING CONDITION AND SYSTEM FOR IT

(75) Inventors: Hirohito Okuda, Yokohama (JP); Toshifumi Honda, Yokohama (JP); Hisae Yamamura, Yokohama (JP); Yuji Takagi, Yokohama (JP); Hideaki Doi, Yokohama (JP); Shigeshi Yoshinaga, Ebina (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/413,468

(22) Filed: Oct. 6, 1999

(30) Foreign Application Priority Data

Oct. 6, 1998 (JP) .......................................... 10-284438

(51) Int. Cl.[7] .............................................. G05B 13/02
(52) U.S. Cl. ...................................................... 700/51
(58) Field of Search ........................... 438/14; 382/147; 364/468.28; 73/88; 324/158.1

(56) References Cited

U.S. PATENT DOCUMENTS 5,621,811 A * 4/1997 Roder .......................... 382/147
5,838,568 A * 11/1998 Dickinson et al. ..... 364/468.28

* cited by examiner

Primary Examiner—John F. Niebling
Assistant Examiner—Andre C Stevenson
(74) Attorney, Agent, or Firm—Antonelli, Terry, Stout & Kraus, LLP

(57) ABSTRACT

With a view to providing a monitoring system for the quality and manufacturing conditions of electronic circuits capable of facilitating the grasping of correlation's between diverse manufacturing conditions and manufacturing states, statistically characteristic images are selected out of a group of images retrieved from a detection information database by specifying at least one out of the values of feature quantities, design information and manufacturing conditions, and are displayed.

16 Claims, 8 Drawing Sheets

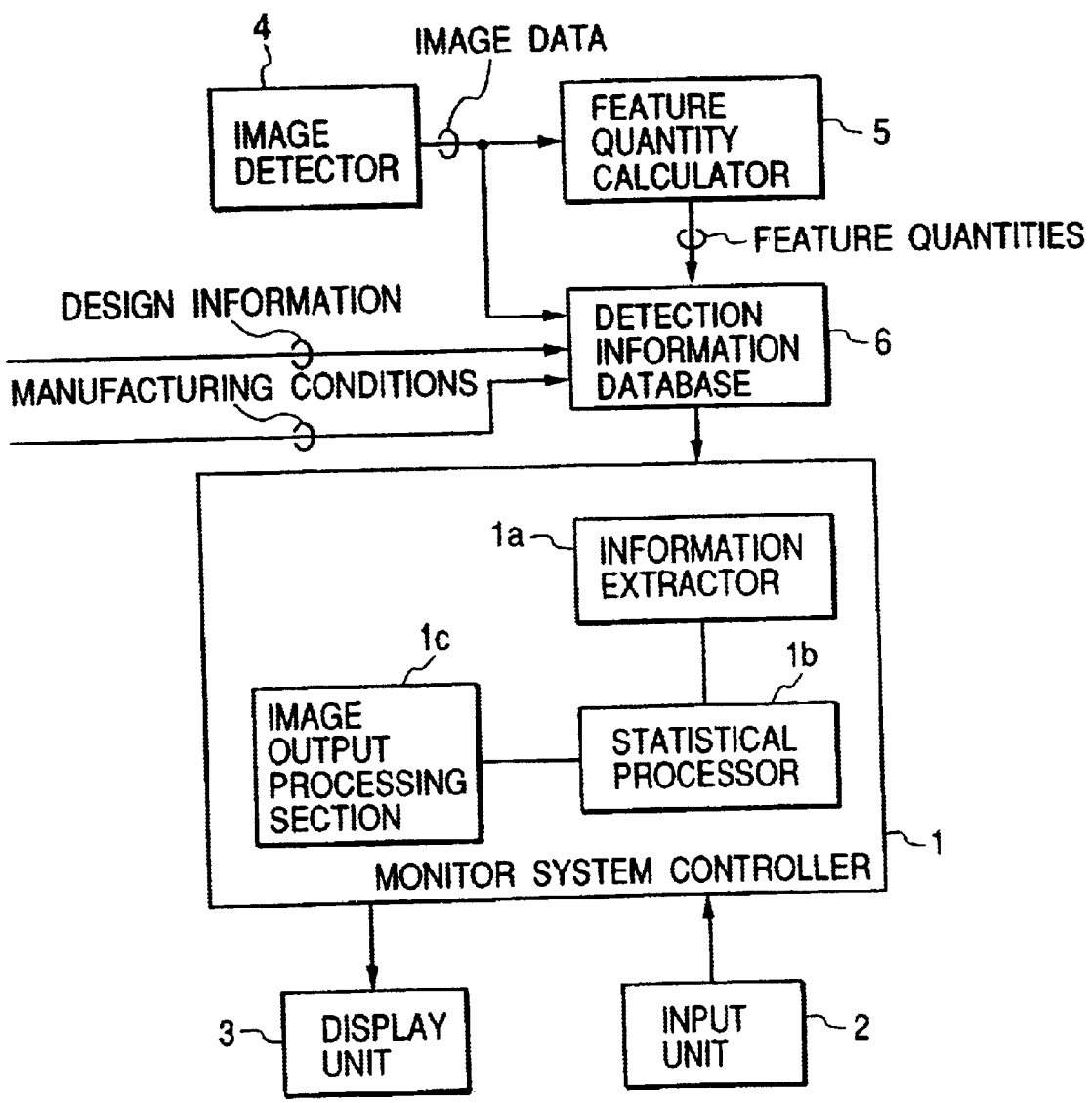

FIG. 2(a)
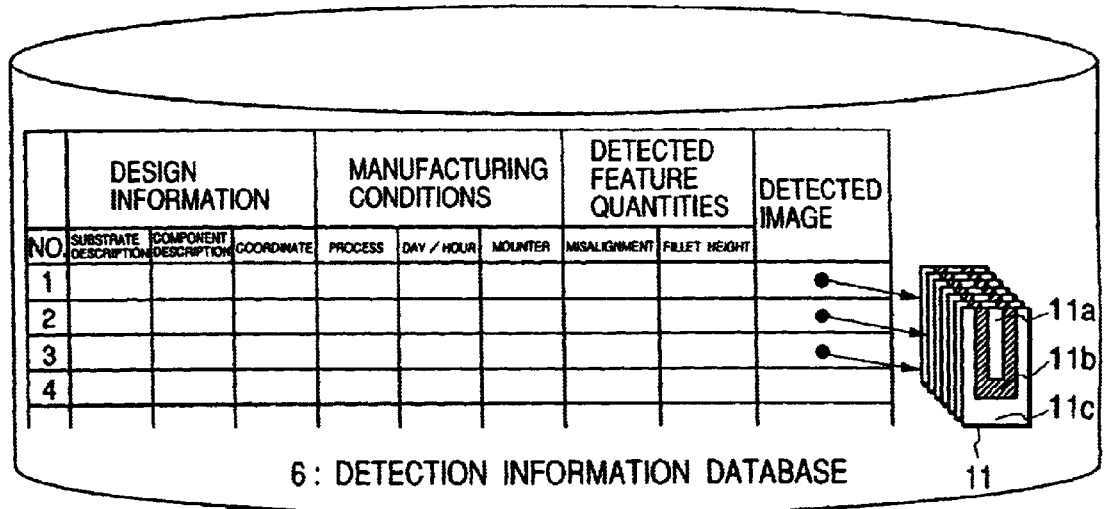
6 : DETECTION INFORMATION DATABASE
FIG. 2(b)
12 : DESIGNATION OF CONDITIONS FOR IMAGE RETRIEVAL AND STATISTICAL OPERATION
FIG. 2(c)
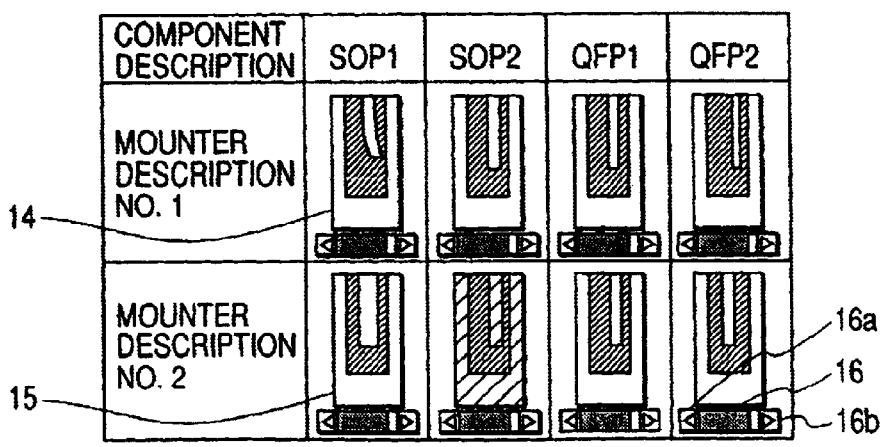
13 : DISPLAY OF RESULTS OF RETRIEVAL AND SUMMATION

13 : DISPLAY OF RESULTS OF RETRIEVAL AND SUMMATION

21 : MOUNTED SUBSTRATE PRODUCTION LINE

31 : DESIGNATION OF CONDITIONS FOR IMAGE RETRIEVAL AND STATISTICAL OPERATION

32 : RESULT OF IMAGE RETRIEVAL

FIG. 5(a)

| SEARCH CONDITIONS | DESIGN INFORMATION | | MANUFACTURING CONDITIONS |
|---|---|---|---|
| | SUBSTRATE DESCRIPTION | COMPONENT DESCRIPTION | PROCESS |
| 1 | ×××  | SOP1 | AFTER SOLDER PRINTING |
| 2 | ××× | SOP2 | AFTER SOLDER PRINTING |

CONDITIONS FOR STATISTICAL OPERATION

| | | |
|---|---|---|
| FEATURE QUANTITY | NOT YET DESIGNATED | ☐ MAX |
| MANUFACTURING CONDITIONS | DAY / HOUR OF MANUFACTURE | ☐ MIN |
| DISPLAY CONTENT | SOLDER QUANTITY HISTOGRAM | ☐ MEDIAN |

41: DESIGNATION OF CONDITIONS FOR IMAGE RETRIEVAL AND STATISTICAL OPERATION

FIG. 5(b)

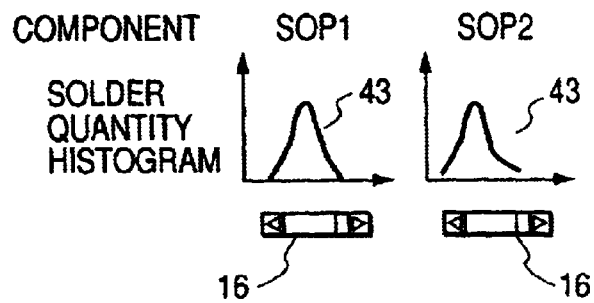

42: DISPLAY SCREEN OF RESULTS OF STATISTICAL OPERATION

FIG. 5(c)

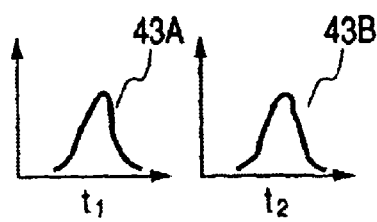

SOP1: SOLDER QUANTITY HISTOGRAM

FIG. 5(d)

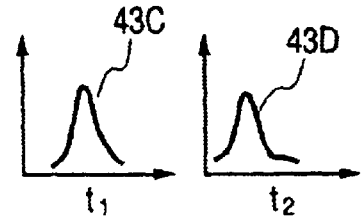

SOP2: SOLDER QUANTITY HISTOGRAM

FIG. 6(a)
| SEARCH CONDITIONS | DESIGN INFORMATION | | MANUFACTURING CONDITIONS |
|---|---|---|---|
| | SUBSTRATE DESCRIPTION | COMPONENT DESCRIPTION | PROCESS |
| 1 | ××× | — | AFTER SOLDER PRINTING |
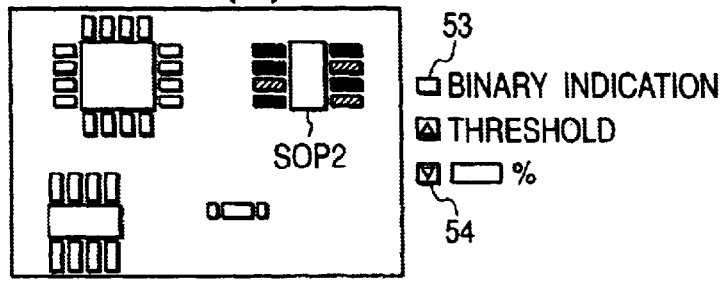
51: DESIGNATION OF CONDITIONS FOR IMAGE RETRIEVAL AND STATISTICAL OPERATION
FIG. 6(b)
52: DISPLAYED RESULT OF DISTRIBUTION OF SOLDER QUANTITY WITHIN PLANE
FIG. 6(c)
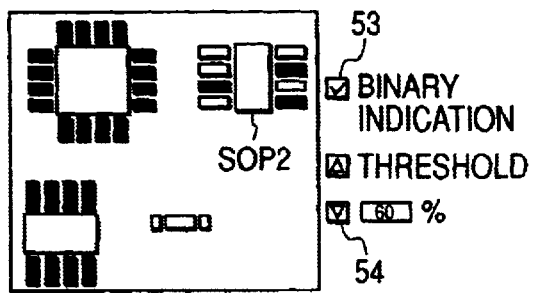
55A: RESULT OF BINARY CONVERSION
FIG. 6(d)
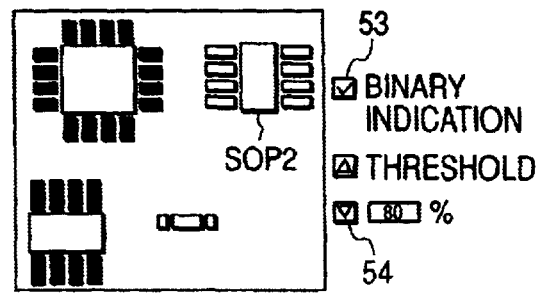
55B: RESULT OF BINARY CONVERSION

6 : DETECTION INFORMATION DATABASE

61 : DESIGNATION OF CONDITIONS FOR IMAGE RETRIEVAL AND STATISTICAL OPERATION

62 : DISPLAY OF RESULTS OF RETRIEVAL AND SUMMATION

METHOD MONITORING A QUALITY OF ELECTRONIC CIRCUITS AND ITS MANUFACTURING CONDITION AND SYSTEM FOR IT

BACKGROUND OF THE INVENTION

The present invention relates to a method and its system for monitoring a quality of electronic circuits equipped with a database of detection information of the quality and manufacturing conditions of electronic circuits detected in each manufacturing process and a display unit for displaying a verious kind of processed data by processing the contents in the database.

More particularly, the present invention relates to a monitoring method and its system which enables to appropriately monitor the quality and manufacturing conditions of electronic circuits formed on a substrate by detecting its images in each process or each substrate and extracting characteristic quantities from the images and outputting on a display a designated statistical data calcurated from the extracted characteristic amounts of the images.

In the prior art, in case of mounting electronic components onto a substrate to form electronic circuits on the substrate, to adjust a manufacturing conditions for mounting electronic components onto a new substrate, a new substrate description is introduced or to identify the factor responsible for any fault that has arisen in a manufacturing process, the fault factor is identified or the manufacturing conditions are adjusted by directly observing the mounted position or on the basis of the total of feature quantities, such as misalignment, to grasp correlation between the mounted conditions of electronic components and the manufacturing conditions.

However, it requires a vast volume of work and is difficult to grasp diverse correlation's between the mounted conditions of components and the manufacturing conditions for each of the wide variety of substrate types by direct observation. On the other hand, attempts are being made to support grasping of the mounted conditions by using external checking apparatuses to detect feature quantities representing the mounted conditions, such as the quantity of misalignment, summing the detected quantities and graphically displaying them, but, as it is difficult to accurately detect feature quantities of a new description, for which conditioning of the checking apparatus is inadequate, it may be difficult to correlate the feature quantities and the mounted conditions. Furthermore, the conventionally used one-dimensional graphic expression of feature quantities, though effective for identifying specific trends of the mounted conditions of components, such as misalignment, can hardly be utilized for grasping more general trends of the mounted conditions.

SUMMARY OF THE INVENTION

The present invention therefore is intended, in view of the problems noted above, to provide a monitoring system for the quality and manufacturing conditions of electronic circuits capable of supporting the grasping of trends of mounted conditions by selectively displaying, out of a detection information database of the positions where electronic circuits are formed, images well depicting the features of sets of images fitting the conditions for retrieval, or mullet-dimensionally displaying the distribution of feature quantities and the like within the substrate plane.

In order to achieve this object, a monitoring system for the quality and manufacturing conditions of electronic circuits according to the invention, is configured of a database storing, for instance, detected image data on prescribed positions of an electronic circuit formed on a substrate, feature quantities of the prescribed positions calculated on the basis of these detected image data, design information, and manufacturing conditions; a statistical processor for executing statistical processing on a set of data extracted from the database using as the retrieval condition at least one of the feature quantities, design information and manufacturing conditions; and a data display unit for supplying data indicating the results of statistical processing or specific data contained in the set of data on the basis of statistical processing by this statistical processor.

BRIEF DESCRIPTION OF THE DRAWINGS

FIG. 1 is a block diagram illustrating the schematic configuration of a monitoring system for the quality and manufacturing conditions of electronic circuits, which is a preferred embodiment of the invention.

FIG. 2 is a diagram for describing how an analyzed example of a misaligned part mounting position is displayed in the monitoring system for the quality and manufacturing conditions of electronic circuits, which is the embodiment of the invention.

FIG. 5 is a diagram for describing an analyzed example of changes in solder quantity shortage as the day/hour of manufacturing changes in the monitoring system for the quality and manufacturing conditions of electronic circuits, which is the embodiment of the invention.

FIG. 6 is a diagram for describing an example of representation of solder quantity distribution within the substrate plane in the monitoring system for the quality and manufacturing conditions of electronic circuits, which is the embodiment of the invention.

DESCRIPTION OF THE PREFERRED EMBODIMENTS

Figure 3:
FIG. 3 is a diagram showing how another example of misaligned component mounting position, different from that in FIG. 2, is displayed.

A preferred embodiment of the present invention will be described below with reference to the accompanying drawings.

FIG. 1 is a block diagram illustrating the schematic configuration of a monitoring system for the quality and manufacturing conditions of electronic circuits, which is a preferred embodiment of the invention.

In FIG. 1, reference numeral 1 denotes a monitoring system controller (hereinafter referred to simply as the controller) for coordinated control of the whole monitoring system; 2, an input device, such as a keyboard or a mouse, with which the operator gives various input instructions to the controller 1; 3, a display unit, such as a color CRT display or a color liquid crystal display, for displaying screens to show the results of processing by the controller 1 and interactive inputting; 4, image detectors, such as video cameras or digital still cameras, arranged at a plurality of prescribed process steps on the mounting circuit board production line (only one is shown here by reason of the available space for illustration); 5, a feature quantity calculator for calculating feature quantities of prescribed positions (feature quantities of, for instance, a solder pad, a component mounted part and solder joints of mounted components) on the basis of image data detected by the image detectors 4; and 6, a detection information database (hereinafter referred to simply as the database) storing various data (such as detected image data, calculated feature quantities, design information, and manufacturing information). Incidentally, the feature quantity calculator 5 may be provided either in a plurality each corresponding to one of the plurality of image detectors 4, or a single feature quantity calculator 5 may be provided for common use by the plurality of image detectors 4.

Also, within the controller 1, reference sign 1a denotes an information extractor for taking out data within the database 6 in accordance with the conditions for retrieval as instructed by the operator's input; 1b, a statistical processor for executing various statistical processing on a set of data extracted by the information extractor 1a; and 1c, an image output processing section for performing processing to display the results of statistical processing by the statistical processor 1b, specific data contained in the extracted set of data, or screens 3 for interactive inputting.

Here will be described first, with reference to FIG. 2, an example of analysis of misalignment of the component mounting position in the monitoring system of this embodiment, depending on the description of electronic components to be mounted on the mounting circuit board or the description of the mounter for mounting the electronic components by calculating feature quantities on the basis of detected images.

In FIG. 2, in the database 6 are stored detected image data on prescribed positions of the mounting circuit board, featured quantities in the prescribed positions calculated on the basis of these detected image data, design information, and manufacturing conditions. In this embodiment, in the database 6 are stored, as the detected image data, detected image data on the solder pad after solder printing, detected image data on the component mounted part after the mounting of electronic components to the solder pad, and image data on the soldered part after the completion of the soldering of electronic components, and are also stored the respective feature quantities of the aforementioned solder pad, the component mounted part after the mounting of electronic components and the soldered part, design information on each process, and manufacturing conditions of each process, each matched with the pertinent ID information.

The design information includes such items of information as the substrate description, component description, coordinates of the mounting position of components. The manufacturing conditions include such items of information as the process, day/hour of manufacturing and the type of the mounter used for component mounting. The feature quantities include such items of information as the solder quantity, quantity of misalignment and that of lead looseness. The detected image data are stored matched to the pertinent items of design information, manufacturing conditions and feature quantities, so that they can be searched sheet by sheet. To add, reference numeral 11 denotes individual detected images, 11a denoting the lead, 11b, the pad, and 11c, the substrate surface.

Reference numeral 12 denotes an example of screen displayed on the aforementioned display unit 3 to urge the operator to designate the conditions for image retrieval and statistical operation. The operator designates, as the condition or conditions for image retrieval, at least one condition out of design information such as the substrate description and component description together with manufacturing information including the day/hour of manufacturing, process and mounter type, and the kinds and values (or range) of feature quantities. The operator also designates the conditions of statistical operation to specify statistical operation to select a typical one out of searched images, for instance. In the example shown here, it is designated to search images with the component description and mounter description as searching keys and select, out of the set of images fitting the conditions for retrieval, the one with the greatest quantity of misalignment in order to grasp the state of mounting position misalignment dependent upon the component description and mounter description.

Reference numeral 13 denotes an example of screen displayed on the aforementioned display unit 3 to show the results of image retrieval and statistical operation, and here the screen lists up the results of processing under the aforementioned conditions for image retrieval and statistical operation. According to the results of retrieval and statistical operation regarding the misalignment of component description SOP1 mounted with mounter description No. 1 shown in 14, the misalignment is the greatest in the detected image of bent leads (pins). Further according to the results of retrieval regarding component description No. 2 mounted with mounter description No. 2, the misalignment is the greatest in a detected image of leads which are not actually misaligned but shown to be so by erroneous detection of the feature quantity due to image noise.

Now, in order to grasp the trend of misalignment dependent on the mounter description and component description, it is necessary to observe the image of a normal component whose leads are most greatly misaligned. Reference numerals 16 . . . denote a scrolling part for successively displaying a group of images fitting the conditions for retrieval among individual images showing the lead section in the order of misalignment magnitude, the descending or ascending order of misalignment magnitude being selected by clicking the scroll button part 16a or 16b with a mouse or otherwise. Then the operator, by repeating manipulation of the scrolling part 16, can display images in the descending order of misalignment magnitude to select the image of a normal component whose leads are most greatly misaligned.

FIG. 3 is a diagram showing another example of the results of image retrieval and statistical operation displayed on the aforementioned display unit 3. This example illustrated in FIG. 3 shows the operator's choice of the image of a normal component whose leads are most greatly misaligned out of the component descriptions SOP1, SOP2, QFP1 and QFP2 mounted with mounter descriptions No.1 and No. 2.

These contents of the display shown in FIG. 3 lets the operator know that the mounter description No. 1 is more likely to invite misalignments of all the components than the mounter description No. 2.

To add, while the examples shown in FIGS. 2 and 3 are cases in which retrieval and displaying are done using as the key the greatest value as the unique value of a feature quantity, retrieval and displaying may as well be done using as the key the smallest value as the specific value of a feature quantity, or retrieval and displaying may also be done using as the key an average value (median or mean) as the specific value of a feature quantity or a value designated by the operator to represent the degree of deviation.

Furthermore, this embodiment can also retrieve and display, out of a set of image data retrieved from the database 6, what has a specific parameter designating the manufacturing conditions with design information or a feature quantity as the condition for retrieval and, as in the aforementioned instance, can retrieve and display image data whose parameter is a unique or average value or a value representing a designated degree of deviation.

Figures 4A, 4B, 4C:
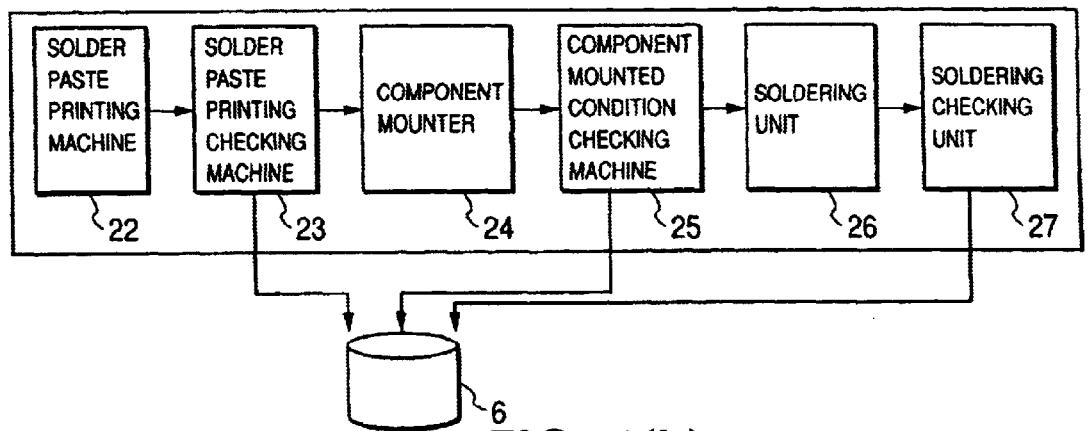
FIG. 4 is a diagram outlining an example of application of the monitoring system for the quality and manufacturing conditions of electronic circuits, which is the embodiment of the invention, to a mounted circuit board production line.

FIG. 4 is a diagram outlining an example of application of the monitoring system for the quality and manufacturing conditions of mounted circuit boards according to the invention, to a mounted circuit board production line.

In FIG. 4, reference numeral 21 denotes a mounting circuit board production line; 22, a solder paste printing machine; 23, a solder paste print checking machine; 24, a component mounter; 25, a component mounted condition checking machine; 26, a soldering unit; 27, a soldering checking unit 27; and 6, the aforementioned database. Incidentally, in FIG. 4, the illustration of the controller 1, input unit 2 and display unit 3 is dispensed with to simplify the diagram, and in this configuration each of the solder paste print checking machine 23, component mounted condition checking machine 25 and soldering checking unit 27 has one of the aforementioned image detectors 4 (each process has a plurality of image detectors as required) and a feature quantity calculator 5.

The solder paste printing machine 22 prints solder paste over the soldering land of the mounting circuit board as the print sheet. The solder paste print checking machine 23 checks the condition of solder paste printing and, at the same time, detects the image of the printed part. The component mounter 24 transfers electronic components to their respective mounting positions on the mounting circuit board with an X-Y stage, and positions and mounts them so that leads and electrodes be located over the solder paste printed on the land. The component mounted condition checking machine 25 checks the mounted condition of the electronic components in the respectively prescribed positions over the mounting circuit board and, at the same time, detects the image of the mounted part. The soldering unit 26, blowing blasts of hot gas from above and underneath the mounting circuit board carried over a conveyor within a furnace, solders the electronic components. The soldering checking unit 27 checks the soldered condition of the electronic components over the mounting circuit board and, at the same time, detects the image of the soldered part.

The solder paste print checking machine 23, component mounted condition checking machine 25 and soldering checking unit 27 described above respectively deliver detected image data, check result data, feature quantities calculated from detected image data, design information on the process before, and manufacturing conditions of the process before to the database 6 via a database serve (not shown). The database 6 individually matches each unit of received data to unique ID information or the like, and stores them in respectively prescribed areas.

Next will be described an instance in which factors inviting lead looseness in the configuration illustrated in FIG. 4 are analyzed. Reference numeral 31 in FIG. 4 denotes an example of screen displayed on the aforementioned display unit 3 to urge the operator to designate the conditions for image retrieval and statistical operation. In the example shown here, the operator searches images with the component description and process as the keys to grasp the condition of lead looseness. Further the operator selects, out of a set of images fitting the conditions for retrieval, the image with the greatest degree of lead looseness, and designates it for displaying.

Reference numeral 32 in FIG. 4 denotes an example of screen displayed on the aforementioned display unit 3 to show the results of image retrieval and statistical operation, and here the screen lists up the results of processing under the aforementioned conditions for image retrieval and statistical operation.

Lead looseness usually results from an insufficient solder quantity or a bent lead. The operator can check whether or not any lead is bent according to the post-soldering retrieval-statistical operation result 34, or whether or not the solder quantity is sufficient according to the post-solder printing retrieval-statistical operation result 33. If the solder quantity is insufficient, the operator can further analyze factors accountable for the insufficient solder quantity by designating manufacturing conditions in the solder printing process, i.e. the mask description, squeegee pressure, solder lot and day/hour of manufacturing among other factors, as keys, and having image retrieval and statistical operation performed again and their results displayed.

Then will be described an instance in which the solder quantity is insufficient with reference to FIG. 5.

Reference numeral 41 in FIG. 5 denotes an example of screen displayed on the aforementioned display unit 3 to urge the operator to designate the conditions for image retrieval and statistical operation. Having confirmed the display of the results of statistical operation shown in FIG. 4, the operator designates on the screen 41 the substrate description, component description, process and period of summation among other factors to analyze variations in solder quantity insufficiency with changes in the day/hour of manufacturing. In this example, the operator instructs preparation of a time series of histograms of solder quantity after the solder printing process in order to analyze variations in the printed quantity of solder over time.

Reference numeral 42 in FIG. 5 denotes an example of screen displayed on the aforementioned display unit 3 to show the results of statistical operation based on the conditions for image retrieval and statistical operation stated above. By manipulating the scrolling part 16 for consecutively displaying solder quantity histograms 43 fitting the conditions for retrieval, the operator can display histograms 43 of data in the progressive or retrogressive order of the day/hour of manufacturing. Then the operator, by repeating the manipulation of the scrolling part 16, can see variations in the distribution of solder quantity over time.

Reference signs 43A and 43b denote histograms of solder quantity distribution of component description SOP1 at times t1 and t2, respectively, and reference signs 43C and 43D, histograms of quantity distribution of component description SOP2 at the times t1 and t2, respectively. By manipulating the scrolling part 16, the operator can display the distribution histograms 43A through 4D. Then the operator, by checking the distribution histograms 43A through 4D, can find that solder quantity insufficiency occurred on SOP2 between the times t1 and t2 because, though there is no appreciable difference between the times t1 and t2 in the solder quantity distribution histogram for SOP1, SOP2 manifests a noticeable difference between the times t1 and t2 in solder quantity distribution histogram. This enables the operator to know that the solder quantity shortage is highly likely to have resulted from a change in manufacturing conditions made between the times t1 and t2.

Next will be described how the distribution of solder quantity within the plane is analyzed with reference to FIG. 6. Reference numeral 51 in FIG. 6 denotes an example of screen displayed on the aforementioned display unit 3 to urge the operator to designate the conditions for image retrieval and statistical operation. In the example shown here, the operator calculates the average of the solder quantity (printed solder quantity) in each soldered position on the mounted circuit board according to the screen 51, and gives an instruction to display the distribution of solder quantity within the plane.

Reference numeral 52 in FIG. 6 denotes an example of screen displayed on the aforementioned display unit 3 to show the results of statistical operation (an example of screen displaying the distribution of solder quantity within the plane) based on the conditions for image retrieval and statistical operation stated above. On the screen 52, the display is expressed on a monochromic gray scale so that parts where the average solder quantity is greater appear brighter and parts where the average solder quantity is smaller appear darker according to the magnitude of the solder quantity relative to the reference level. By checking the displayed result of this distribution of solder quantity within the plane on this screen 52, the operator can see that the solder quantity in the upper right corner of the substrate plane tends to be insufficient. Incidentally, the display may be in color varying with the magnitude of the solder quantity relative to the reference level.

Incidentally, it is not necessarily easy to check the brightness of each soldered part displayed on the screen by direct watching. Therefore, the operator is enabled to have a clear grasp of the distribution of solder quantity within the plane by selecting binary-converted indication on the screen with a binary screen indication designating button 53, and varying a binary threshold with a binary threshold manipulating button 54. Reference signs 55A and 55B denote results of binary indication, the binary threshold being set to 60% and 80%, respectively, and areas where the average solder quantity is greater than the designated threshold are expressed in solid black. By checking the indications on these 55A and 55B, the operator can easily and reliably see that the solder quantity in the upper right corner of the substrate plane tends to be insufficient.

Supposing, for instance, that the changes in manufacturing conditions made between the times t1 and t2 are those of the mask and the solder material lot, the operator can assume that the insufficiency of solder quantity is highly likely to be due to the mask change because any change in solder material lot is unlikely to result in a conspicuous insufficiency of solder quantity in a specific position within the substrate plane as mentioned above.

Then will be described with reference to FIG. 7 an example of adjustment of manufacturing conditions when a new substrate description is introduced into the production line. In adjusting the manufacturing conditions for a new substrate description, the finished state under the newly set manufacturing conditions is identified with reference to the manufacturing conditions applied to the description for mass production, the findings are fed back to the adjusting work, and these two steps are repeated. The operator compares on the basis of detected images, for instance, differences between products from the new substrate description and the substrate description for mass production under their respective manufacturing conditions with a view to identifying differences in soldered state between the new substrate description and the substrate description.

Description here refers to an instance in which the mask has been altered to a thinner one for a new substrate subscription, which is to be mounted with components with a fine lead pitch, not mounted on the description for mass production, to reduce the quantity of solder printing in order to enable such components to be mounted. In FIG. 7, reference numeral 6 denotes the aforementioned database. In the database 6 are registered in advance, for both the new substrate description and the substrate description for mass production, design information, manufacturing conditions, detected image data on portions to be detected, and feature quantities calculated from these detected image data. The feature quantities include the fillet volumes of solder joints.

Figure 7A:
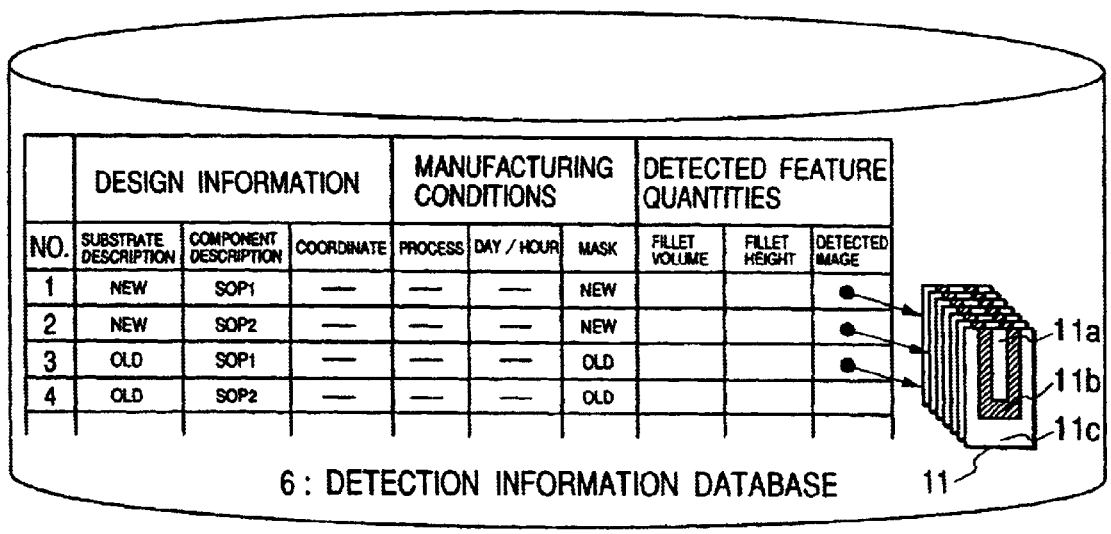
FIG. 7 is a diagram for describing an example of analysis comparing the solder joints on new and conventional substrates in the monitoring system for the quality and manufacturing conditions of electronic circuits, which is the embodiment of the invention.
Figure 7B:
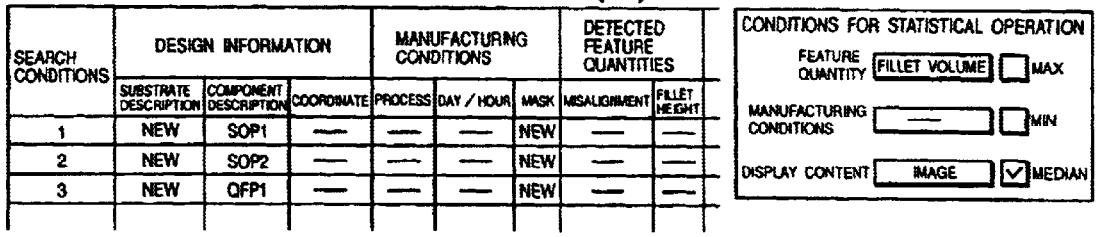
Figure 7C:
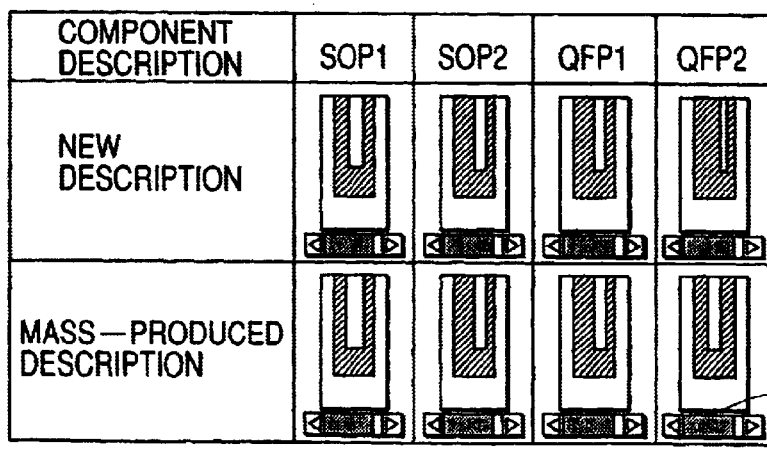

Reference numeral 61 in FIG. 7 denotes an example of screen displayed on the aforementioned display unit 3 to urge the operator to designate the conditions for image retrieval and statistical operation. In the example shown here, it is instructed to retrieve detected images after the soldering of each component in manufacturing processes under the respective conditions for the new substrate description and the substrate description for mass production, and to display images fitting the conditions for retrieval. Further the conditions for statistical operation are designated so as to display images in which the fillet volume is its median.

Reference numeral 62 in FIG. 7 denotes an example of screen displayed on the aforementioned display unit 3 to show the results of statistical operation based on the conditions for image retrieval and statistical operation stated above. By the results displayed on the screen 62, the operator can check whether or not the new substrate description is suffering insufficiency of solder or the like, and further can quickly and easily identify differences from the substrate description for mass production.

Although the foregoing description of the preferred embodiment referred to a monitoring system for component soldering positions, the invention can also be applied to a monitoring system for the manufacturing conditions or quality (as to defects, for example) of semiconductors. Thus, the monitoring system may as well consist of a database storing, for instance, detected image data on prescribed positions of a semiconductor wafer, feature quantities of the manufacturing conditions of the semiconductor calculated on the basis of these detected image data, feature quantities of defects in the semiconductor calculated on the basis of detected image data on such defects, defective description, design information on the semiconductor, and manufacturing conditions of the semiconductor; a statistical processor for executing statistical processing on a set of data extracted from the database using as the retrieval condition at least one of feature quantities of the manufacturing conditions, feature quantities of defects, design information and manufacturing conditions; and a data display unit for supplying data indicating the results of statistical processing or specific data contained in the set of data on the basis of statistical processing by this statistical processor.

An example of application this invention to a semiconductor device quality monitoring system is described in FIG. 8.

Figure 8B:
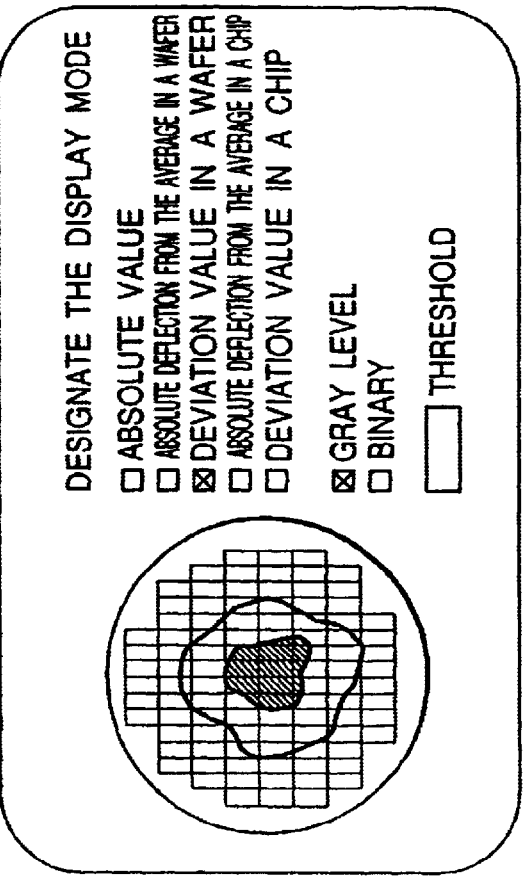
FIG. 8 is a diagram for describing an example of applying the present invention to a semiconductor device quality monitoring system.
Figure 8A:
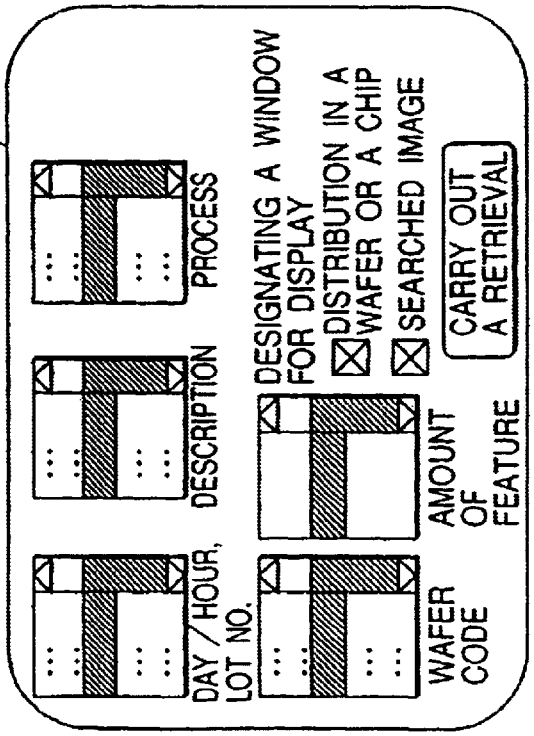

Reference numeral 81 in FIG. 8(a) is a screen image displaying tags for designating a window of the image retrieval conditions. The image retrieval condition of this example is day/hour of manufacturing, lot No., description, process and wafer code, and an image matching to the selected retrieval condition is searched. An operator can select an output form of the retrieval to display on the screen by selecting one of the feature distribution button and searched image button displayed on the monitor screen.

After selecting one of the buttons, operator clicks the carrying out button and the selected image is displayed on the screen.

Reference numeral 82 in FIG. 8(b) is an screen image displaying the feature distribution in a wafer designated on the screen 81. The detected images fitting to the image retrieval condition are processed and the distribution of the extracted feature of the processed image is displayed with gray level, color or binary. For example, when the amount of the feature is large, the displayed image is bright and the amount of the feature is small, the displayed image is dark.

And when selecting the check box of binary and input the threshold level for binarization, the operator can recognize the region where the amount of the feature quantities, such as line width, defect size, brightness of the defect, exceeds the predetermined value.

From the image 82, the operator can easily and promptly recognize the distribution of the selected feature in a wafer. And on the screen 82, the operator can also select the display mode which displays one of the absolute value, absolute deflection from the average in a wafer, deviation value in a wafer, absolute deflection from the average in a chip and deviation value in a chip. By selecting the absolute deflection from the average or deviation value in the chip, the operator can recognize the tendency of the distribution in the chip.

Figure 8C:
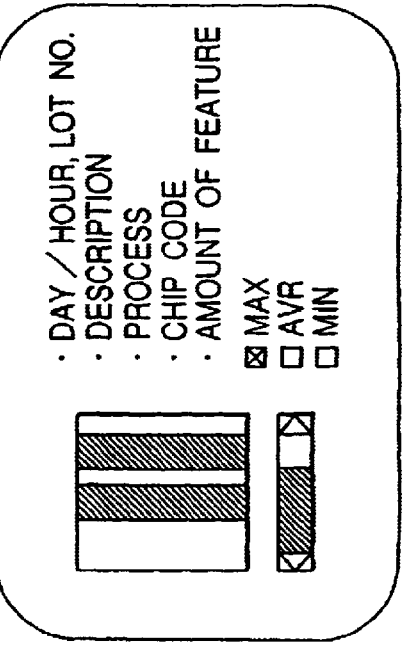

Reference numeral 83 in FIG. 8(c) is a screen displaying a searched image designated on the display 81 by clicking the button of image retrieval. The detected images fitting to the image retrieval condition are processed and the statistically analyzed image is displayed on the screen.

In FIG. 8(c), the statistically analyzed image is ordered by the quantity of the feature and one of the image whose quantity is maximum, minimum or average is displayed by selecting the button displayed on the screen 83. And the ordered image is also displayed sequentially by operating the scroll bar on the screen 83. From the screen 83 displaying the statistically analyzed image, the operator can easily and promptly recognize the trend or the variations over time of the manufacturing condition.

As hitherto described, the present invention makes it possible to selectively display an image well depicting the characteristics of a set of images retrieved from a detection information database under desired conditions or to display the distribution of detected feature quantities within the substrate plane, and to readily identify correlation between diverse manufacturing conditions and the mounted conditions for a wide variety of descriptions.

In the above described embodiment, retrieval image, detected feature quantity, design information and manufacturing condition are used as a data base. This invention, however, is also achieved without using one of or both of the design information and the manufacturing condition as a data base.

What is claimed is:

1. A monitoring system for electronic circuits, comprising:
   a database storing at least detected image data of prescribed positions of an electronic circuit formed on a substrate, and feature quantities of said prescribed positions calculated on the basis of these detected image data;
   a data display unit having a screen for inputting at least one selected retrieval condition and for displaying information stored in said database; and
   a statistical processor for executing statistical processing on a set of data extracted from said database according to the inputted retrieval condition;
   wherein said data display unit displays image data statistically processed by said statistical processor.

2. A monitoring system for electronic circuits according to the claim 1, wherein said detected image data on said prescribed positions include at least one type of data out of detected image data on solder pads after solder printing, detected image data on component mounting parts after the mounting of electronic components to the solder pads, and detected image data on solder joints after the completion of the soldering of electronic components.

3. A monitoring system for electronic circuits according to the claim 1, wherein said statistical processor selects, out of a set of image data retrieved from said database, image data of which said feature quantity represents a unique or average value or a value representing a designated degree of deviation with said design information or said manufacturing conditions as the condition for retrieval, and said data display unit displays the image data selected by said statistical processor.

4. A monitoring system for electronic circuits according to the claim 1, wherein said statistical processor selects, as image data of which said feature quantity represents a unique value, image data of which said feature quantity represents a maximum or minimum value, or as image data of which said feature quantity represents an average value, image data of which said feature quantity represents a median or a mean.

5. A monitoring system for electronic circuits according to the claim 1, wherein said statistical processor selects, out of a set of data retrieved from said database using as the retrieval condition said design information or said feature quantities, image data whose parameter designating said manufacturing conditions represents a unique or average value or a value representing a designated degree of deviation, and said data display unit displays the image data selected by said statistical processor.

6. A monitoring system for electronic circuits according to the claim 5, wherein said statistical processor selects, as image data of which said parameter value represents a unique value, image data of which said parameter value represents a maximum or minimum value, or as image data of which said parameter value represents an average value, image data of which said parameter value represents a median or a mean.

7. A monitoring system for electronic circuits according to the claim 1, wherein said statistical processor processes a set of data retrieved from said database using as the retrieval conditions staid design information or said manufacturing conditions to align the image data on the basis of the values of said feature quantities, and said data display unit can consecutively display the group of image data, aligned by said statistical processor, in the order of the magnitude of the value of the detected feature quantity.

8. A monitoring system for electronic circuits according to the claim 1, wherein said statistical processor processes a set of data retrieved from said database using as the retrieval condition said design information or said feature quantities to align the image data on the basis of the values of parameters designating said manufacturing conditions, and said data display unit is enabled to consecutively display the group of image data, aligned by said statistical processor, in the order of the magnitude of the value of the parameter designating said manufacturing conditions.

9. A monitoring system for electronic circuits according to the claim 1, wherein said statistical processor processes a set of data retrieved from said database using as the retrieval condition said design information or said manufacturing conditions to calculate the average value of said feature quantity in each of many individual portions on said electronic circuit formed on a substrate, and said data display unit displays either on a monochromic gray scale or in color, according to the size of each, a symbol image representing the average value of said feature quantity, calculated by said statistical processor, in each of many individual portions on said electronic circuit formed on a substrate.

10. A monitoring system for electronic circuits according to the claim 1, wherein said statistical processor processes a set of data retrieved from said database using as the retrieval condition said design information or said manufacturing conditions to calculate the average value of said feature quantity in each of many individual portions on said electronic circuit formed on a substrate, and sorts these calculated average values of said feature quantities according to a threshold designated by the operator, and said data display unit displays symbol images resulting from the sorting by said statistical processor in their respective individual portions of the image displayed on said electronic circuit formed on a substrate screen.

11. A monitoring system for electronic circuits according to the claim 2, further comprising an image detector for detecting, in any one out of a step after solder paste printing, a step after component mounting and a step after component soldering, the image of the portion to be checked, and registering it in said database.

12. A monitoring system for electronic circuits according to the claim 1, wherein the database still more storing at least on of design information and manufacturing conditions.

13. A monitoring system for electronic circuits according to claim 1, wherein said image data displayed on said data display unit is a distribution of the feature quantity on said substrate.

14. A monitoring system for electronic circuits, comprising:

a database storage storing at least detected image data of semiconductor wafers, feature quantities of the manufacturing conditions of the semiconductor wafers calculated on the basis of these detected image data, feature quantities of defects on the semiconductor wafer calculated on the basis of detected defect image data, design information and manufacturing conditions;

a data display unit having a screen for inputting at least one selected retrieval condition and for displaying information stored in said database storage; and a statistical processor for executing statistical processing on a set of data extracted from said database according to the inputted retrieval condition;

wherein said data display unit displaying image data statistically processed by said statistical processor.

15. A monitoring system for electronic circuits according to the claim 14, the database storage also storing at least one of design information on the semiconductors and manufacturing conditions of the semiconductors.

16. A monitoring system for electronic circuits according to claim 13, wherein said image data displayed on said data display unit is a distribution of the feature quantity on said semiconductor wafer.

* * * * *